United States Patent
Hsia

(10) Patent No.: US 7,516,539 B2
(45) Date of Patent: Apr. 14, 2009

(54) APPARATUS FOR TRANSPLANTING MULTI-BOARD

(75) Inventor: Hsin-Sheng Hsia, Taipei (TW)

(73) Assignee: Unimicron Technology Corp., Taoyuan (TW)

(*) Notice: Subject to any disclaimer, the term of this patent is extended or adjusted under 35 U.S.C. 154(b) by 0 days.

(21) Appl. No.: 11/780,686

(22) Filed: Jul. 20, 2007

(65) Prior Publication Data

US 2008/0244897 A1    Oct. 9, 2008

(30) Foreign Application Priority Data

Apr. 4, 2007    (TW) .............................. 96112005 A

(51) Int. Cl.
*B23P 19/00* (2006.01)
(52) U.S. Cl. .............................. 29/740; 29/742; 29/744; 29/759; 29/33 P; 198/460.2; 198/346.1; 414/744.5
(58) Field of Classification Search .................. 29/729, 29/739–744, 759, 833–834, 721, 564.1–564.5; 414/737, 752, 744.5; 198/460.2, 812, 468.2, 198/346.1; 382/151, 147, 287; 269/14, 20
See application file for complete search history.

(56) References Cited

U.S. PATENT DOCUMENTS

| | | | | |
|---|---|---|---|---|
| 3,699,640 A | * | 10/1972 | Cranston et al. ............. | 228/106 |
| 4,680,627 A | * | 7/1987 | Sase et al. ................... | 382/147 |
| 5,120,925 A | * | 6/1992 | Ohnishi et al. .......... | 219/121.12 |
| 5,336,935 A | * | 8/1994 | Shitanda et al. ............. | 307/116 |
| 5,680,699 A | * | 10/1997 | Vos .............................. | 29/833 |
| 6,085,581 A | * | 7/2000 | Jones et al. ................... | 73/105 |
| 6,526,651 B1 | * | 3/2003 | Hwang ......................... | 29/740 |
| 6,673,315 B2 | * | 1/2004 | Sheridan et al. ............... | 422/50 |
| 6,681,468 B1 | * | 1/2004 | Uchiyama et al. ........ | 29/407.01 |
| 6,772,619 B2 | * | 8/2004 | Nashiki et al. .............. | 73/1.79 |
| 6,807,726 B2 | * | 10/2004 | Iisaka et al. ................... | 29/740 |
| 7,010,853 B2 | * | 3/2006 | Oe ............................... | 29/740 |
| 2006/0005378 A1 | * | 1/2006 | Chan ........................... | 29/739 |

FOREIGN PATENT DOCUMENTS

TW        1228020        2/2005
TW     200616511        5/2006

* cited by examiner

*Primary Examiner*—Minh Trinh
(74) *Attorney, Agent, or Firm*—J.C. Patents

(57) ABSTRACT

An apparatus for transplanting a multi-board is provided. This apparatus includes an orientation device, a calibration device, and an image-adjusting device. The orientation device has a first movable platform, and the multi-board is fixed on the first movable platform. The calibration device has a second movable platform and is used for moving a substitution circuit board to a recombination position of the multi-board. The image-adjusting device captures image data of the multi-board and the substitution circuit board and compares the image data to obtain an error signal. The calibration device receives the error signal and moves the second movable platform according to the error signal in order to calibrate the relative position between the substitution circuit board and the multi-board.

19 Claims, 5 Drawing Sheets

APPARATUS FOR TRANSPLANTING MULTI-BOARD

CROSS-REFERENCE TO RELATED APPLICATION

This application claims the priority benefit of Taiwan application serial no. 96112005, filed on Apr. 4, 2007. All disclosure of the Taiwan application is incorporated herein by reference.

BACKGROUND OF THE INVENTION

1. Field of the Invention

The present invention generally relates to a multi-board, in particular, to an apparatus for transplanting a multi-board.

2. Description of Related Art

Currently, the manufacturing of printed circuit board (PCB) is to divide a PCB plane into a plurality of daughter boards so that the PCB plane is turned into a multi-board having the plurality of daughter boards. However, the fail rate of these daughter boards is about 5%~7% and it will be a waste if the multi-board having defective daughter boards is just discarded. Thus, a manufacturer of multi-board usually takes those good daughter boards from the multi-board as substitution circuit boards and uses the substitution circuit boards for replacing those defective daughter boards on other multi-board, so that the daughter boards on those recombined multi-board are all qualified products.

It should be noted that the gap formed on a multi-board by removing a defective daughter board is usually larger than the size of a substitution circuit board. Thus, to avoid large size difference when a substitution circuit board is assembled to a multi-board, some calibration and assembly methods have been provided, such as the "Method for Replacing Defective Multi-circuit PCB" disclosed in Taiwan Patent No. 228020 and the "METHOD FOR REPAIRING PRINTED-CIRCUIT SUBSTRATES" disclosed in earlier Taiwan Patent No. 200616511.

FIG. 1 illustrates a first conventional alignment method for recombining a substitution circuit board and a multi-board. Referring to FIG. 1, first, a multi-board 100, a substitution circuit board 120a, and a template 200 are provided. The multi-board 100 includes a frame 110, a plurality of daughter boards 120, and a gap 130 formed by removing a defective daughter board (not shown). The substitution circuit board 120a is a good daughter board taken from another multi-board. Each of the daughter boards 120 has two alignment holes 122, and the substitution circuit board 120a also has two alignment holes 122a. A plurality of pins 210 are disposed on a surface of the template 200, and the alignment holes 122 and 122a are respectively corresponding to the pins 210. To assemble the substitution circuit board 120a to the gap 130 on the multi-board 100, first, the multi-board 100 is assembled to the template 200 by inserting the pins 210 of the template 200 into the corresponding alignment holes 122. The substitution circuit board 120a is then assembled into the gap 130 by inserting the pins 210 within the gap 130 into the corresponding alignment holes 122a. As described above, the alignment between the multi-board 100 and the substitution circuit board 120a is completed.

FIG. 2 illustrates a second conventional alignment method for recombining a substitution circuit board and a multi-board. Referring to FIG. 2, first, the multi-board 100 and substitution circuit board 120a are provided, and additionally, a platform 310, four high-resolution camera lenses 320, an image divider 330, and a display 340 are provided. The platform 310 has a plurality of datum holes 312, and the alignment holes 122 and 122a are respectively corresponding to the datum holes 312. Moreover, the camera lenses 320 are suitable for capturing images of the datum holes 312, and the images captured by the camera lenses 320 are suitable for being enlarged and displayed on the display 340 at the same time via the image divider 330.

First, the multi-board 100 is assembled onto the platform 310, and then it is observed from the display 340 that whether the two alignment holes 122 overlap two datum holes 312 in order to align the multi-board 100. Next, the substitution circuit board 120a is assembled onto the platform 310, and then the two alignment holes 122a are coincided with two corresponding datum holes 312 by observing from the display 340. Accordingly the alignment between the multi-board 100 and the substitution circuit board 120a is completed.

FIG. 3 illustrates a third conventional alignment method for recombining a substitution circuit board and a multi-board. Referring to FIG. 3, first, the multi-board 100, substitution circuit board 120a, and display 340 are provided, and additionally, a high-resolution camera 350 and an image comparison computer 360. The camera 350 captures image comparison points (for example, optical points) on the multi-board 100 and the substitution circuit board 120a, and enlarges and displays the points on the display 340. The image comparison computer 360 stores the original alignment data of the multi-board 100 or the positions of the alignment holes 122 thereof as the basic data for image comparison.

After the camera 350 has captured the images of the multi-board 100 and the substitution circuit board 120a and transmitted the images to the image comparison computer 360, the image comparison computer 360 compares the data and the stored basic data. Accordingly, the relative position between the multi-board 100 and the substitution circuit board 120a can be calibrated manually or automatically according to the comparison result.

It should be noted that the three conventional methods for recombining a substitution circuit board and a multi-board are only suitable for the multi-board having alignment holes. As to those multi-board with high density circuit layout, there will be no space for disposing one or multiple alignment holes, therefore the alignment mechanisms described above cannot be used and a new transplanting apparatus for multi-board has to be provided.

SUMMARY OF THE INVENTION

Accordingly, the present invention is directed to an apparatus for transplanting a multi-board. The apparatus is used for calibrating the relative position between a substitution circuit board and the multi-board.

The present invention provides an apparatus for transplanting a multi-board. The apparatus includes an orientation device, a calibration device, and an image-adjusting device. The orientation device moves the multi-board to an initial position. The orientation device has a first movable platform, and the multi-board is fixed on the first movable platform. The calibration device is used to move a substitution circuit board to a recombination position of the multi-board. The calibration device has a second movable platform, and the substitution circuit board is fixed on the second movable platform. The image-adjusting device captures image data of the multi-board and the substitution circuit board and compares the captured image data to obtain an error signal. The calibration device receives the error signal sent by the image-adjusting device and moves the second movable platform according to the error signal in order to calibrate the relative position between the substitution circuit board and the multi-board.

According to an embodiment of the present invention, the apparatus for transplanting a multi-board further includes a first adsorption device disposed on the first movable platform, and the multi-board is fixed on the first movable platform by the first adsorption device.

According to an embodiment of the present invention, the first adsorption device includes a vacuum adsorption device.

According to an embodiment of the present invention, the apparatus for transplanting a multi-board further includes a second adsorption device disposed on the second movable platform, and the substitution circuit board is fixed on the second movable platform by the second adsorption device.

According to an embodiment of the present invention, the second adsorption device includes a vacuum adsorption device.

According to an embodiment of the present invention, the first movable platform includes an X-Y biaxial lead screw platform.

According to an embodiment of the present invention, the second movable platform includes an X-Y biaxial lead screw platform.

According to an embodiment of the present invention, the orientation device includes a servomotor for driving the first movable platform.

According to an embodiment of the present invention, the calibration device includes a servomotor for driving the second movable platform.

According to an embodiment of the present invention, the orientation device further includes a first θ-axis rotary platform disposed on the first movable platform, and the multi-board is fixed on the first movable platform by the first θ-axis rotary platform and rotates corresponding to the first movable platform.

According to an embodiment of the present invention, the calibration device further includes a second θ-axis rotary platform disposed on the second movable platform, and the substitution circuit board is fixed on the second movable platform by the second θ-axis rotary platform and rotates corresponding to the second movable platform.

According to an embodiment of the present invention, the image-adjusting device includes an image-capturing unit, a processing unit, and a display unit. The image-capturing unit captures image data of the multi-board and the substitution circuit board. The processing unit compares the captured image data to obtain an error signal and transmits the error signal to the calibration device. The display unit is connected to the image-capturing unit and the processing unit for displaying images of the multi-board and the substitution circuit board before and after the substitution circuit board is transplanted.

According to an embodiment of the present invention, the error signal includes one of the groups composed of X-axis displacement, Y-axis displacement, and θ-axis angle displacement.

The present invention provides an apparatus for transplanting a multi-board, the multi-board and a substitution circuit board are respectively fixed on a first and a second movable platform by adsorption devices, and the second movable platform is driven by a servomotor so as to move the substitution circuit board. Accordingly, the apparatus provided by the present invention can be used for calibrating the relative position between the substitution circuit board and the multi-board.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1:
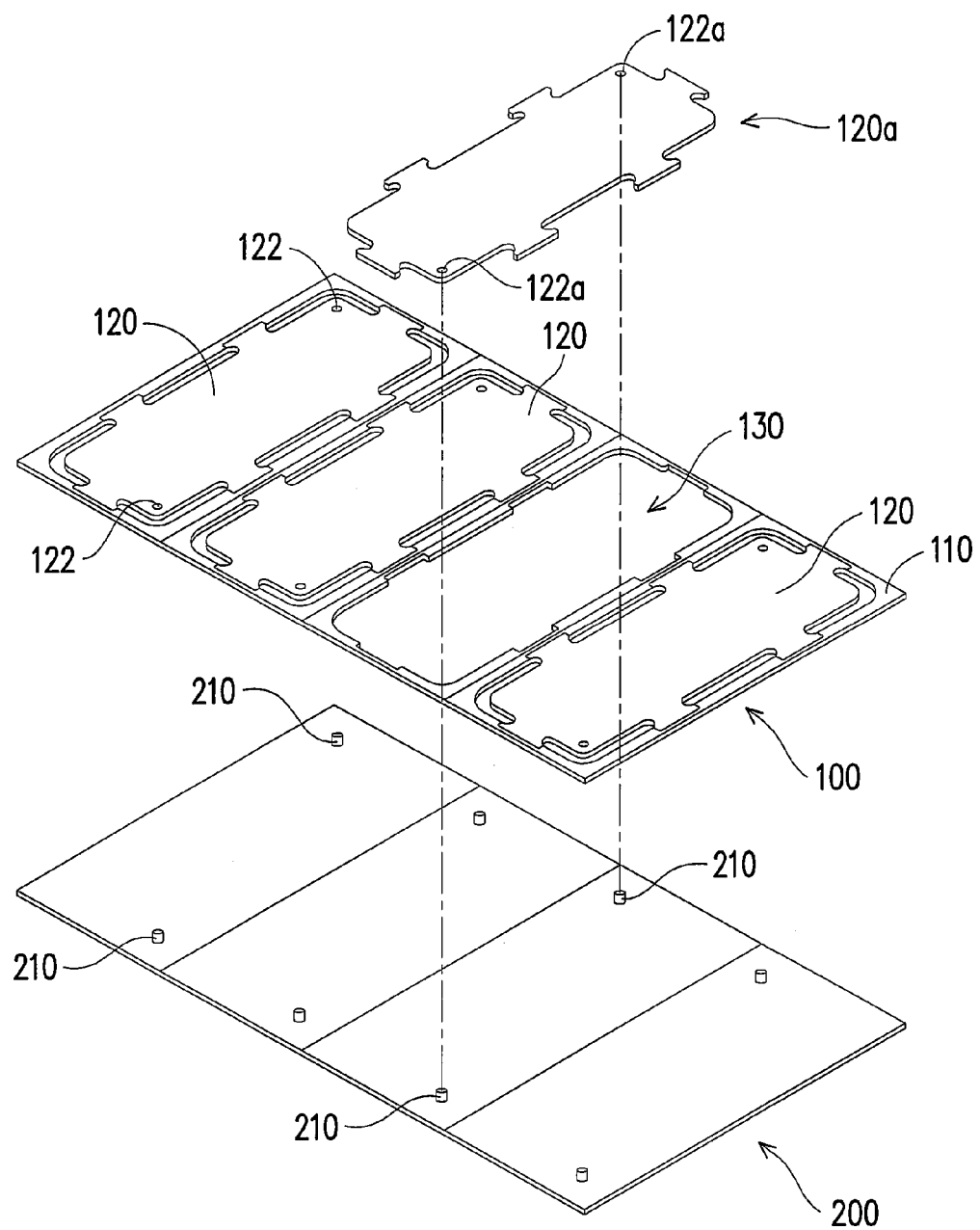
FIG. 1 illustrates a first conventional alignment method for recombining a substitution circuit board and a multi-board.
Figure 2:
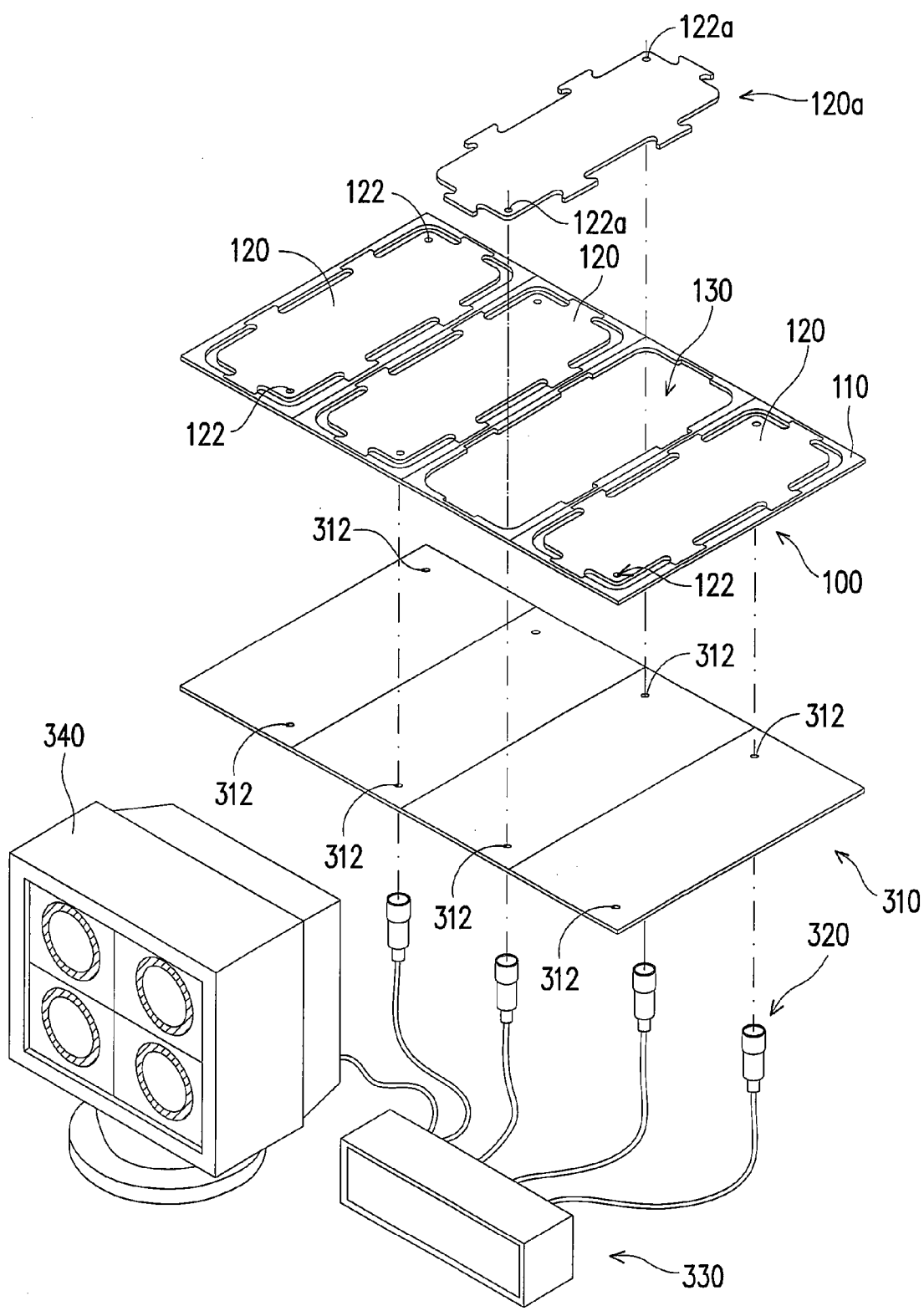
FIG. 2 illustrates a second conventional alignment method for recombining a substitution circuit board and a multi-board.
Figure 3:
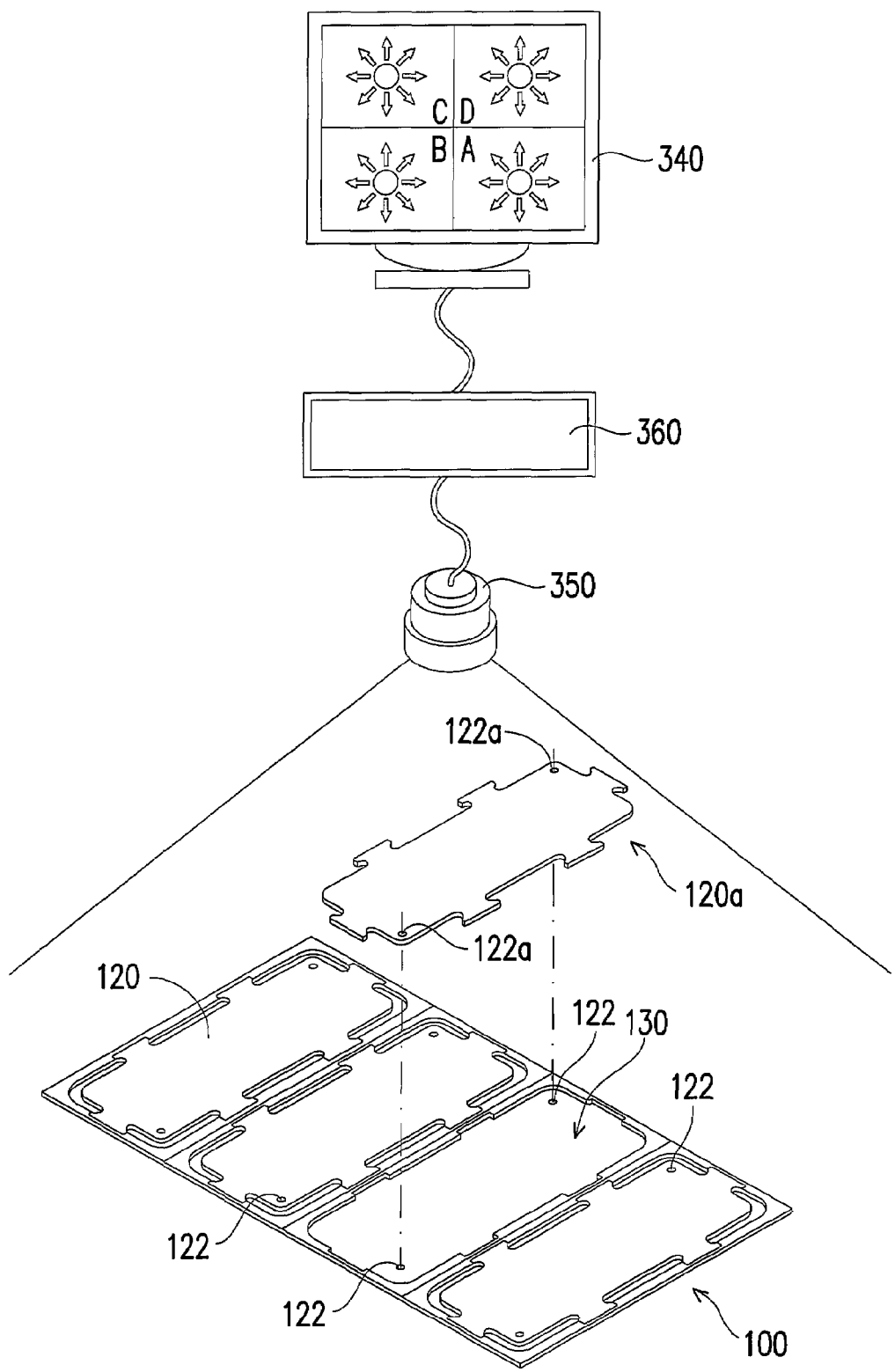
FIG. 3 illustrates a third conventional alignment method for recombining a substitution circuit board and a multi-board.

Reference will now be made in detail to the present preferred embodiments of the invention, examples of which are illustrated in the accompanying drawings. Wherever possible, the same reference numbers are used in the drawings and the description to refer to the same or like parts.

Figure 4:
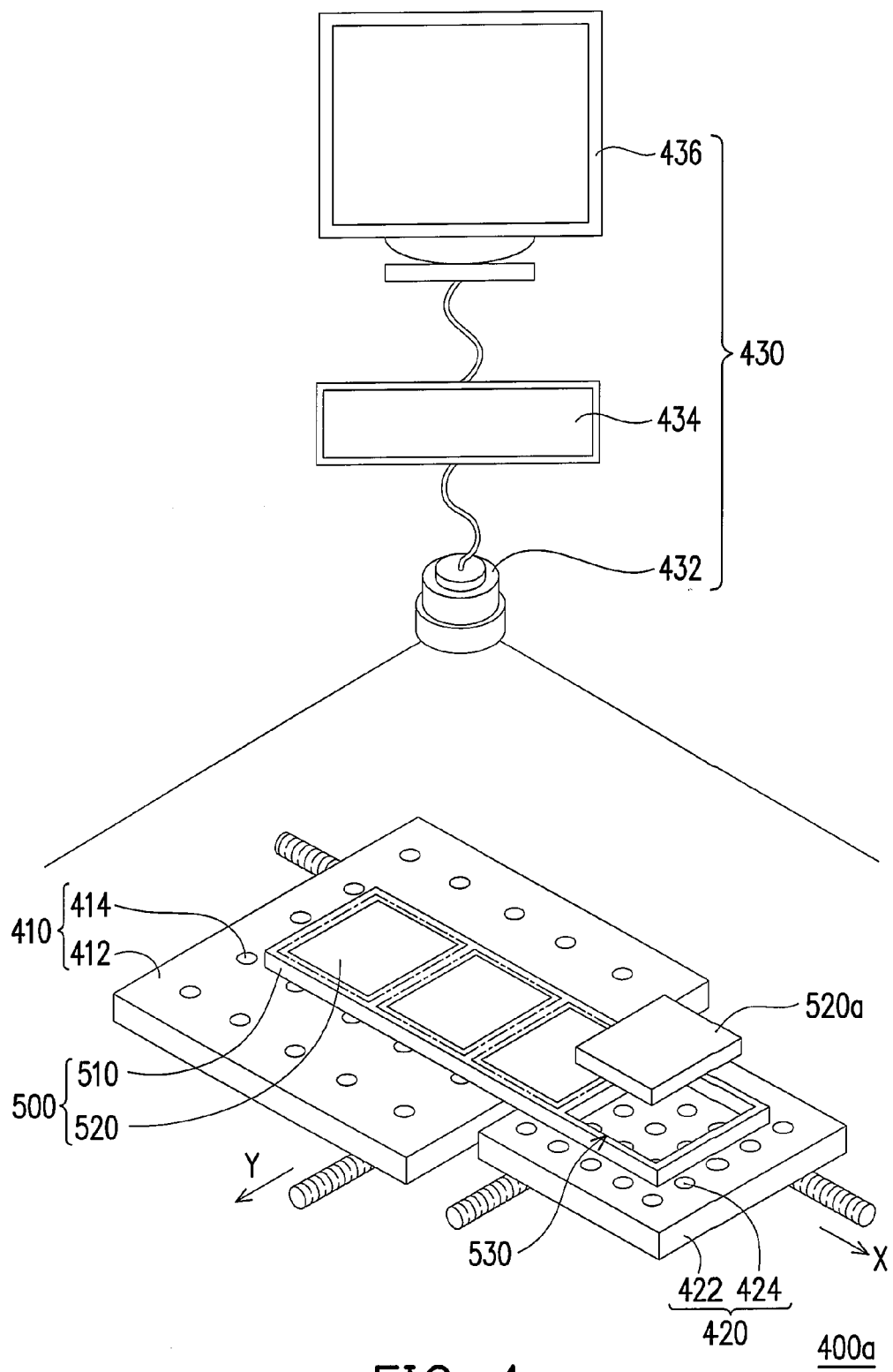
FIG. 4 illustrates the structure of an apparatus for transplanting a multi-board according to a first embodiment of the present invention.

FIG. 4 illustrates the structure of an apparatus for transplanting a multi-board according to a first embodiment of the present invention. Referring to FIG. 4, the multi-board transplanting apparatus 400a is used for calibrating the relative position between a multi-board 500 and a substitution circuit board 520a. The multi-board 500 includes a frame 510 and a plurality of daughter boards 520, and the multi-board 500 has a gap 530 formed after removing a defective daughter board 520. The substitution circuit board 520a is a good daughter board taken from another multi-board and is used for being filled in the gap 530.

The multi-board transplanting apparatus 400a includes an orientation device 410, a calibration device 420, and an image-adjusting apparatus 430. The multi-board 500 is fixed on a first movable platform 412 of the orientation device 410 so that the orientation device 410 can move the multi-board 500 to an initial position through the first movable platform 412. The substitution circuit board 520a is fixed on a second movable platform 422 of the calibration device 420 so that the calibration device 420 can move the substitution circuit board 520a to a recombination position through the second movable platform 422. In other words, the calibration device 420 trims the position of the substitution circuit board 520a in the gap 530 so as to move the substitution circuit board 520a along axis X or axis Y until the substitution circuit board 520a is positioned precisely at the predetermined recombination position.

The image-adjusting apparatus 430 captures image data of the multi-board 500 and the substitution circuit board 520a and compares the captured image data to obtain an error signal. After that, the image-adjusting apparatus 430 transmits the error signal to the calibration device 420, so that the calibration device 420 moves the second movable platform 422 according to the error signal in order to calibrate the relative position between the substitution circuit board 520a and the multi-board 500. In other words, the image-adjusting apparatus 430 calculates the error between the actual position of the substitution circuit board 520a and the predetermined recombination position, then adjusts the output power of the calibration device 420 in a range through a feedback control, and the calibration device 420 stops to move the second movable platform 422 when a feedback control signal approaches zero, which means the actual position of the substitution circuit board 520a has coincided with the predetermined recombination position. As described above, the transplanting operation for the multi-board 500 is completed.

In the present embodiment, the multi-board transplanting apparatus 400a may further include at least one first adsorption device 414 disposed on the first movable platform 412 and at least one second adsorption device 424 disposed on the second movable platform 422. Moreover, the orientation device 410 may further include a first servomotor (not shown), and the calibration device 420 may further include a second servomotor (not shown). The first adsorption device 414 and the second adsorption device 424 may be vacuum adsorption devices. The first movable platform 412 and the second movable platform 422 may be X-Y biaxial lead screw platforms, dual-rail platforms, hydraulic- or pneumatic-driven platforms etc. The first movable platform 412 and the second movable platform 422 have fast transient response and precision positioning and perform positioning operation through position sensors and feedback control mechanism. The first adsorption device 414 is used for adsorbing the multi-board 500 to fix the multi-board 500 on the first movable platform 412, and the first servomotor is used for moving the first movable platform 412 so that the first movable platform 412 can move the multi-board 500 along axis X or axis Y. Similarly, the second adsorption device 424 is used for adsorbing the substitution circuit board 520a to fix the substitution circuit board 520a on the second movable platform 422, and the second servomotor is used for moving the second movable platform 422 so that the second movable platform 422 can move the substitution circuit board 520a along axis X or axis Y.

In addition, the image-adjusting apparatus 430 may include an image-capturing unit 432, a processing unit 434, and a display unit 436. The image-capturing unit 432 is used for capturing image data of the multi-board 500 and the substitution circuit board 520a. The processing unit 434 is used for comparing the captured image data to obtain an error signal and transmitting the error signal to the calibration device 420. The image-capturing unit 432 may be composed of lens module having charge coupled devices (CCD), super CCD, complementary metal-oxide semiconductors (CMOS), or variable pixel sizes (VPS), and the error signal may be X-axis displacement, Y-axis displacement, or a combination of X-axis displacement and Y-axis displacements. Moreover, the display unit 436 is connected to the image-capturing unit 432 and the processing unit 434 for displaying the image data of the multi-board 500 and the substitution circuit board 520a before and after the transplantation is performed.

To be specific, the processing unit 434 is used for storing in advance a first image data when the multi-board 500 is at an initial position thereof, and the display unit 436 is used for displaying the first image data. The first image data may be the contour or pad position of the multi-board 500 when the multi-board 500 is at the initial position thereof before the defective daughter board is removed. Here the contour or pad position of the defective daughter board is the recombination position. When the multi-board 500 is disposed on the first movable platform 412, the multi-board 500 can be fixed on the first movable platform 412 by starting the first adsorption device 414 which is partially under the multi-board 500. Next, by operating the image-adjusting apparatus 430, the image-capturing unit 432 captures a second image data of the multi-board 500 and transmits the second image data to the processing unit 434 and the display unit 436. The second image data may be the contour or pad position of the multi-board 500 when the multi-board 500 is disposed on the first movable platform 412. Here the processing unit 434 compares the first image data and the second image data to obtain a first error signal, and the display unit 436 displays the first error signal. In the present embodiment, the first error signal may be the relative position between the contour of the multi-board 500 and the initial position thereof when the multi-board 500 is disposed on the first movable platform 412. Next, the first servomotor of the orientation device 410 moves the first movable platform 412 along axis X or axis Y according to the first error signal so that the first movable platform 412 moves the multi-board 500 to the initial position thereof. Meanwhile, whether or not the multi-board 500 has been moved to the initial position thereof can be determined by observing from the display unit 436.

Thereafter, the substitution circuit board 520a is disposed in the gap 530 of the multi-board 500, and the substitution circuit board 520a is fixed on the second movable platform 422 by starting the second adsorption device 424 which is partially under the substitution circuit board 520a. Next, by operating the image-adjusting apparatus 430, the image-capturing unit 432 captures a third image data of the substitution circuit board 520a and transmits the third image data to the processing unit 434 and the display unit 436. The third image data maybe a contour or pad position of the substitution circuit board 520a when the substitution circuit board 520a is disposed on the second movable platform 422. Here the processing unit 434 compares the first image data and the third image data to obtain a second error signal, and the display unit 436 displays the second error signal. In the present embodiment, the second error signal may be the relative position between the contour of the substitution circuit board 520a and the recombination position when the substitution circuit board 520a is disposed on the second movable platform 422. Next, the second servomotor of the calibration device 420 moves the second movable platform 422 along axis X and axis Y according to the second error signal so that the second movable platform 422 can move the substitution circuit board 520a to the recombination position. Meanwhile, whether or not the substitution circuit board 520a has been moved to the recombination position can be determined by observing from the display unit 436. After that, the gap between the multi-board 500 and the substitution circuit board 520a can be filled up by using an automatic dispenser or through a stencil printing process to complete the recombination of the multi-board 500 and the substitution circuit board 520a.

However, the application of the present invention is not limited to the embodiment described above. For example, a user may control the first movable platform 412 manually through the first servomotor according to the first error signal displayed by the display unit 436 so as to move the multi-board 500. Or, the user may also control the second movable platform 422 manually through the second servomotor according to the second error signal displayed by the display unit 436 so as to move the substitution circuit board 520a.

It can be understood from foregoing embodiments of the present invention that the relative position between the multi-board 500 and the substitution circuit board 520a along axis X or axis Y can be calibrated manually or automatically by controlling the relative movement of the first movable platform 412 and the second movable platform 422.

Figure 5:
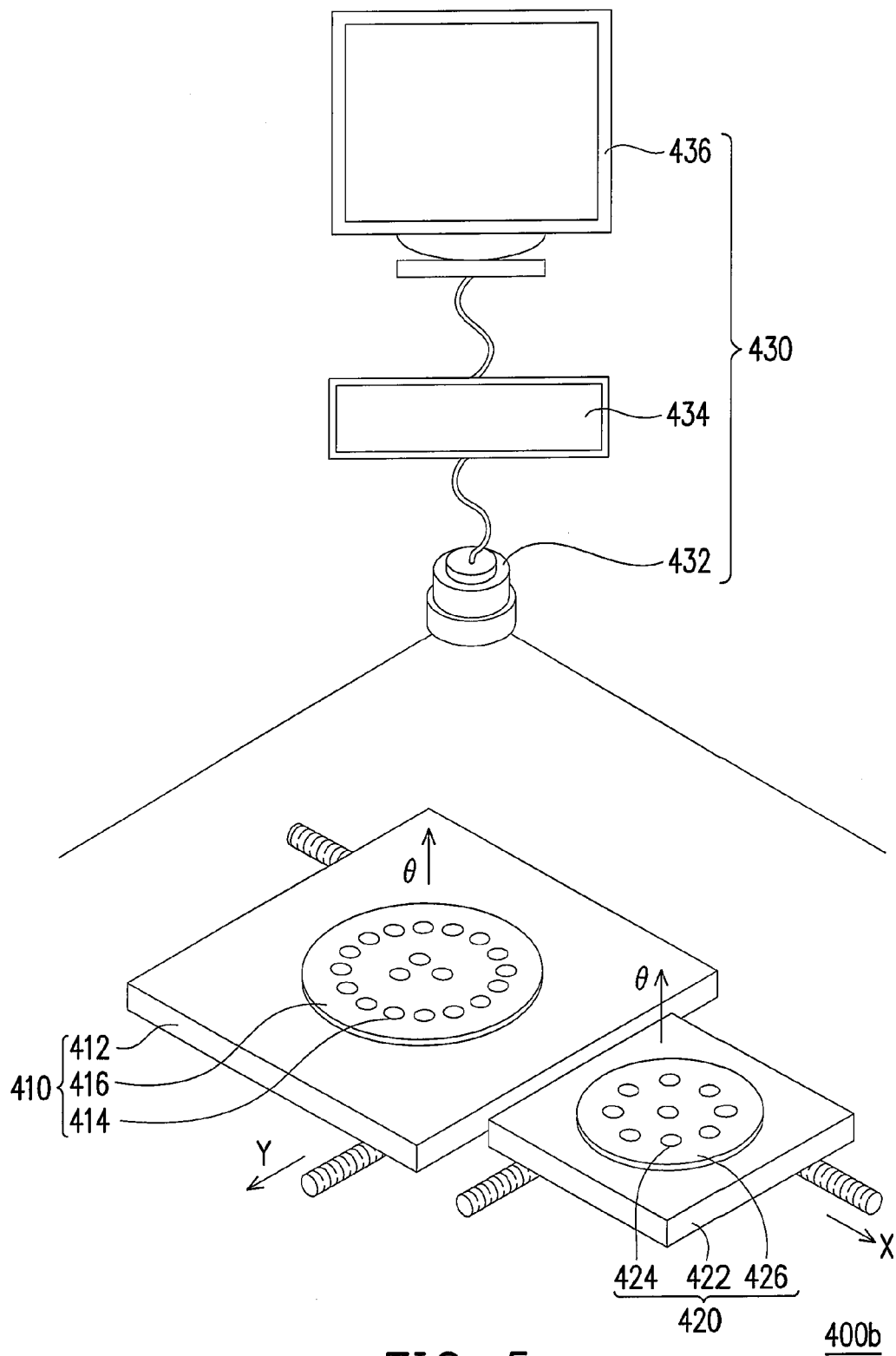
FIG. 5 illustrates the structure of an apparatus for transplanting a multi-board according to a second embodiment of the present invention.

FIG. 5 illustrates the structure of an apparatus for transplanting a multi-board according to a second embodiment of the present invention. Referring to FIG. 5, in the present embodiment, the multi-board transplanting apparatus 400b has similar structure as that of the multi-board transplanting apparatus 400a in the first embodiment, and the difference between the two apparatus is that the orientation device 410 in the second embodiment further includes a first θ-axis rotary platform 416, and the calibration device 420 further includes a second θ-axis rotary platform 426.

In the present embodiment, the first θ-axis rotary platform 416 is disposed on the first movable platform 412, and the first adsorption device 414 is disposed on the first θ-axis rotary platform 416, so that the multi-board 500 can be fixed on the first movable platform 412 through the first θ-axis rotary platform 416 and rotate corresponding to the first movable platform 412. On the other hand, the second θ-axis rotary platform 426 is disposed on the second movable platform 422, and the second adsorption device 424 is disposed on the second θ-axis rotary platform 426, so that the substitution circuit board 520a can be fixed on the second movable platform 422 through the second θ-axis rotary platform 426 and rotate corresponding to the second movable platform 422. Here the first and the second error signal provided by the processing unit 434 of the image-adjusting apparatus 430 may include at least one of X-axis displacement, Y-axis displacement, and θ-axis angle displacement. However, the method of the multi-board transplanting apparatus 400b for adjusting the relative position between the multi-board 500 and the substitution circuit board 520a is similar to that used in the first embodiment therefore will not be described herein.

It can be understood from the embodiment described above that not only the relative position between the multi-board 500 and substitution circuit board 520a along axis X or axis Y can be manually or automatically calibrated by controlling the relative movement of the first movable platform 412 and the second movable platform 422, the relative position between the multi-board 500 and the substitution circuit board 520a along axis θ can also be manually or automatically calibrated by controlling the relative rotation of the first θ-axis rotary platform 416 and the second θ-axis rotary platform 426.

Besides, according to the present invention, the image-adjusting apparatus 430 is used for capturing contour or pad image data of the multi-board 500 and the substitution circuit board 520a, and the relative position between the multi-board 500 and the substitution circuit board 520a is calibrated according to a comparison result of the capture image data. Thus, compared to the conventional methods for recombining a substitution circuit board and a multi-board, the multi-board transplanting apparatus 400a provided by the present invention can be used for recombining the multi-board 500 which does not have an alignment hole or optical point due to its high density circuit layout.

In summary, the multi-board transplanting apparatus in the present invention has at least following advantages:
1. A multi-board and a substitution circuit board are respectively fixed on a first movable platform and a second movable platform through a first adsorption device and a second adsorption device without any pin, therefore the assembly of the multi-board and substitution circuit board is easy and not restricted by the shape and alignment hole of the multi-board, and accordingly the transplanting apparatus provided by the present invention is suitable for any type of multi-board.
2. In a transplanting apparatus provided by the present invention, an error is controlled by an image-adjusting device through a feedback control, and the positions of the multi-board and the substitution circuit board are respectively calibrated by an orientation device and a calibration device; thus, the operation in the present invention is very convenient and precision positioning up to micrometer or nanometer level can be achieved.
3. A processing unit may further transmit an error signal to the orientation device and the calibration device so that the multi-board transplanting apparatus can automatically calibrate the relative position between the multi-board and the substitution circuit board.
4. The present invention can be used for recombining a multi-board which does not have any alignment hole or optical point due to its high density circuit layout.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. An apparatus for transplanting a multi-board, the apparatus comprising:
    an orientation device, for moving the multi-board to an initial position, wherein the orientation device has a first movable platform, and the multi-board is fixed on the first movable platform;
    a calibration device, for moving a substitution circuit board to a recombination position of the multi-board, wherein the calibration device has a second movable platform, and the substitution circuit board is fixed on the second movable platform;
    an image-adjusting device, for capturing image data of the multi-board and the substitution circuit board, and comparing the captured image data to obtain an error signal, wherein the calibration device receives the error signal sent by the image-adjusting device and moves the second movable platform according to the error signal in order to calibrate the relative position between the substitution circuit board and the multi-board; and
    a first adsorption device, disposed on the first movable platform, wherein the multi-board is fixed on the first movable platform by the first adsorption device.

2. The transplanting apparatus according to claim 1, wherein the first adsorption device comprises a vacuum adsorption device.

3. The transplanting apparatus according to claim 1, further comprising a second adsorption device disposed on the second movable platform, wherein the substitution circuit board is fixed on the second movable platform by the second adsorption device.

4. The transplanting apparatus according to claim 3, wherein the second adsorption device comprises a vacuum adsorption device.

5. The transplanting apparatus according to claim 1, wherein the first movable platform comprises an X-Y biaxial lead screw platform.

6. The transplanting apparatus according to claim 1, wherein the second movable platform comprises an X-Y biaxial lead screw platform.

7. The transplanting apparatus according to claim 1, wherein the orientation device comprises a servomotor for driving the first movable platform.

8. The transplanting apparatus according to claim 1, wherein the calibration device comprises a servomotor for driving the second movable platform.

9. The transplanting apparatus according to claim 1, wherein the orientation device further comprises a first θ-axis rotary platform disposed on the first movable platform, and the multi-board is fixed on the first movable platform by the first θ-axis rotary platform and rotates corresponding to the first movable platform.

10. The transplanting apparatus according to claim 1, wherein the calibration device further comprises a second θ-axis rotary platform disposed on the second movable platform, and the substitution circuit board is fixed on the second movable platform by the second θ-axis rotary platform and rotates corresponding to the second movable platform.

11. The transplanting apparatus according to claim 1, wherein the image-adjusting device comprises:
   an image-capturing unit, for capturing the image data of the multi-board and the substitution circuit board;
   a processing unit, for comparing the captured image data to obtain the error signal, and transmitting the error signal to the calibration device; and
   a display unit, connected to the image-capturing unit and the processing unit, for displaying images of the multi-board and the substitution circuit board before and after the substitution circuit board is transplanted.

12. The transplanting apparatus according to claim 1, wherein the error signal comprises one of the groups composed of X-axis displacement, Y-axis displacement, and θ-axis angle displacement.

13. An apparatus for transplanting a multi-board, the apparatus comprising:
   an orientation device, for moving the multi-board to an initial position, wherein the orientation device has a first movable platform, and the multi-board is fixed on the first movable platform;
   a calibration device, for moving a substitution circuit board to a recombination position of the multi-board, wherein the calibration device has a second movable platform, and the substitution circuit board is fixed on the second movable platform;
   an image-adjusting device, for capturing image data of the multi-board and the substitution circuit board, and comparing the captured image data to obtain an error signal, wherein the calibration device receives the error signal sent by the image-adjusting device and moves the second movable platform according to the error signal in order to calibrate the relative position between the substitution circuit board and the multi-board; and
   an adsorption device disposed on the second movable platform, wherein the substitution circuit board is fixed on the second movable platform by the adsorption device, and the adsorption device comprises a vacuum adsorption device.

14. The transplanting apparatus according to claim 13, wherein the first movable platform further comprises an X-Y biaxial lead screw platform, the orientation device further comprises a first θ-axis rotary platform disposed on the first movable platform, and the multi-board is fixed on the first movable platform by the first θ-axis rotary platform and rotates corresponding to the first movable platform.

15. The transplanting apparatus according to claim 13, wherein the second movable platform comprises an X-Y biaxial lead screw platform, the calibration device further comprises a second θ-axis rotary platform disposed on the second movable platform, and the substitution circuit board is fixed on the second movable platform by the second θ-axis rotary platform and rotates corresponding to the second movable platform.

16. The transplanting apparatus according to claim 13, wherein the orientation device comprises a servomotor for driving the first movable platform.

17. The transplanting apparatus according to claim 13, wherein the calibration device comprises a servomotor for driving the second movable platform.

18. The transplanting apparatus according to claim 13, wherein the image-adjusting device comprises:
   an image-capturing unit, for capturing the image data of the multi-board and the substitution circuit board;
   a processing unit, for comparing the captured image data to obtain the error signal, and transmitting the error signal to the calibration device; and
   a display unit, connected to the image-capturing unit and the processing unit, for displaying images of the multi-board and the substitution circuit board before and after the substitution circuit board is transplanted.

19. The transplanting apparatus according to claim 13, wherein the error signal comprises one of the groups composed of X-axis displacement, Y-axis displacement, and θ-axis angle displacement.

* * * * *